United States Patent
Wetle et al.

(10) Patent No.: US 11,101,894 B2
(45) Date of Patent: Aug. 24, 2021

(54) MULTIBAND PHOTONIC INTEGRATED CIRCUIT (PIC) I AND Q DEMODULATOR

(71) Applicant: Raytheon Company, Waltham, MA (US)

(72) Inventors: Michael D. Wetle, Long Beach, CA (US); Rajesh Sathiamurthy, Tustin, CA (US); Paige E. Muncy, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/663,098

(22) Filed: Oct. 24, 2019

(65) Prior Publication Data

US 2021/0124106 A1    Apr. 29, 2021

(51) Int. Cl.
*H04B 10/61*        (2013.01)
*H04B 10/63*        (2013.01)
(Continued)

(52) U.S. Cl.
CPC ......... *H04B 10/613* (2013.01); *G02B 6/0026* (2013.01); *G02B 6/02052* (2013.01);
(Continued)

(58) Field of Classification Search
CPC .............. H04B 10/613; H04B 10/63; H04B 2210/006; G02B 6/0026; G02B 6/02052;
(Continued)

(56) References Cited

U.S. PATENT DOCUMENTS 6,778,317 B1    8/2004 Hurrell et al.
6,930,820 B1    8/2005 Shooks, Jr. et al.
(Continued)

FOREIGN PATENT DOCUMENTS

| CN | 110233678 A | 9/2019 |
| EP | 1056230 B1 | 4/2008 |
| WO | 2017/031227 A1 | 2/2017 |

OTHER PUBLICATIONS

Gao et al., "All-optical, ultra-wideband microwave I/Q mixer and image-reject frequency down-converter," Optics Letters, vol. 42, No. 6, Mar. 2017, 4 pages.
(Continued)

*Primary Examiner* — Leslie C Pascal (57) ABSTRACT

An apparatus includes a first modulator configured to modulate a radio frequency (RF) input signal onto a first optical signal and a second modulator configured to modulate a local oscillator (LO) signal onto a second optical signal. The apparatus also includes a photonic integrated circuit having an optical demodulator configured to generate, using the modulated optical signals, I and Q signals representing a demodulated version of the RF input signal. The optical demodulator may include an optical filter bank having multiple optical filters, where different optical filters are configured to pass different frequencies or frequency ranges. The optical filters may include at least one narrowband optical filter and/or one or more tunable optical filters.

The narrowband optical filter(s) may be configured to isolate global navigation satellite system-related signals. The tunable optical filter(s) may be configured to isolate signals over a frequency range of about 900 MHz to about 12 GHz.

21 Claims, 6 Drawing Sheets

(51) Int. Cl.
 F21V 8/00 (2006.01)
 G02B 6/02 (2006.01)
 G02B 6/42 (2006.01)
 G02B 6/12 (2006.01)
(52) U.S. Cl.
 CPC .......... G02B 6/4279 (2013.01); H04B 10/63 (2013.01); *G02B 2006/12109* (2013.01); *G02B 2006/12142* (2013.01); *H04B 2210/006* (2013.01)
(58) Field of Classification Search
 CPC ........ G02B 6/4279; G02B 2006/12109; G02B 2006/12142
 See application file for complete search history.

(56) References Cited

U.S. PATENT DOCUMENTS

| | | | | |
|---|---|---|---|---|
| 7,218,820 | B2 | 5/2007 | Maida, Jr. | |
| 9,742,498 | B1 | 8/2017 | Nagarajan | |
| 10,128,886 | B1* | 11/2018 | Barnard | H04B 15/06 |
| 2003/0179766 | A1* | 9/2003 | Azadet | H04J 1/12 |
| | | | | 370/436 |
| 2007/0071456 | A1* | 3/2007 | Chen | H04B 10/615 |
| | | | | 398/204 |
| 2013/0028610 | A1* | 1/2013 | DeSalvo | H04B 10/25758 |
| | | | | 398/139 |
| 2019/0109564 | A1 | 4/2019 | Kanter | |
| 2021/0055425 | A1* | 2/2021 | Guo | G01S 19/37 |

OTHER PUBLICATIONS

Xiong, et al., "A monolithic 56 Gb/s silicon photonic pulse-amplitude modulation transmitter," Optica, Apr. 2016, 6 pages.
Tu et al., "Analog RF Performance of a CMOS Optical Filter", 3rd IEEE International Conference on Group IV Photonics, Sep. 2006, 4 pages.
Onori et al., "A Photonically Enabled Compact 0.5-28.5 GHz RF Scanning Receiver", Journal of Lightwave Technology, vol. 36, No. 10, May 2018, 10 pages.
Woodward et al., "Systems Perspectives on Optically-Assisted RF Signal Processing Using Silicon Photonics", International Topical Meeting on Microwave Photonics jointly held with the 2011 Asia-Pacific Microwave Photonics Conference, Oct. 2011, 4 pages.
International Search Report dated Jul. 24, 2020 in connection with counterpart International Patent Application No. PCT/US2020/070039, 4 pages.
Written Opinion of the International Searching Authority dated Jul. 24, 2020 in connection with counterpart International Patent Application No. PCT/US2020/070039, 8 pages.

* cited by examiner

MULTIBAND PHOTONIC INTEGRATED CIRCUIT (PIC) I AND Q DEMODULATOR

TECHNICAL FIELD

This disclosure relates generally to navigation systems and other communication systems. More specifically, this disclosure relates to a multiband photonic integrated circuit (PIC) I and Q demodulator.

BACKGROUND

A global navigation satellite system (GNSS) uses satellites to support geo-spatial positioning. A GNSS receiver typically receives signals from multiple GNSS satellites and uses known positions of the GNSS satellites to calculate a position of the receiver. One example of a GNSS system is the Global Positioning System (GPS), which uses a constellation of satellites that continuously transmit their current positions and their current times as held by atomic clocks on-board the satellites. A GPS receiver monitors the signals from multiple GPS satellites and uses the positions and times transmitted by the satellites to determine its position. A minimum of four signals from four GPS satellites typically need to be received in order to calculate the position of a GPS receiver in three-dimensional space and to correct for deviation of the receiver's internal clock from the satellites' clocks.

Global navigation satellite systems such as GPS are widely used in various civilian and military applications. This makes global navigation satellite systems a regular target for attack by adversaries or other illicit actors hoping to disrupt economic, military, or other activities. For example, GNSS signals are typically very weak at ground-level, often around −125 dBm or lower. This makes it particularly easy for attackers or other illicit actors to transmit signals at the same frequencies as the GNSS signals, thereby drowning out or jamming the GNSS signals. This can disrupt a receiver's ability to determine its position accurately.

SUMMARY

This disclosure provides a multiband photonic integrated circuit (PIC) I and Q demodulator.

In a first embodiment, an apparatus includes a first modulator configured to modulate a radio frequency (RF) input signal onto a first optical signal and a second modulator configured to modulate a local oscillator (LO) signal onto a second optical signal. The apparatus also includes a photonic integrated circuit having an optical demodulator configured to generate, using the first and second modulated optical signals, I and Q signals representing a demodulated version of the RF input signal.

In a second embodiment, a system includes an RF front end configured to obtain an RF input signal. The system also includes a photonic integrated circuit having a first modulator configured to modulate the RF input signal onto a first optical signal, a second modulator configured to modulate an LO signal onto a second optical signal, and an optical demodulator configured to generate, using the first and second modulated optical signals, I and Q signals representing a demodulated version of the RF input signal. The system further includes an analog-to-digital converter configured to convert the I and Q signals into digital values and a processor configured to process the digital values.

In a third embodiment, a method includes modulating an RF input signal onto a first optical signal and modulating an LO signal onto a second optical signal. The method also includes, using a photonic integrated circuit having an optical demodulator, generating, based on the first and second modulated optical signals, I and Q signals representing a demodulated version of the RF input signal.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which.

DETAILED DESCRIPTION

FIGS. 1 through 7, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

As noted above, global navigation satellite systems (GNSSs), such as the Global Positioning System (GPS), are widely used in various civilian and military applications and are regular targets for attack by adversaries or other illicit actors hoping to disrupt economic, military, or other activities. For example, GNSS signals are typically very weak at ground-level, which makes it particularly easy for attackers or other illicit actors to transmit signals at the same frequencies as the GNSS signals to jam the GNSS signals and disrupt a receiver's ability to determine its position accurately. As a result of these and other issues, the GPS system is being modernized, and additional GPS signals will be augmenting older reliable GPS signals. These additional GPS signals include signals transmitted using the so-called "M code," which can be selectively increased in power when needed to help reduce or prevent jamming issues.

Various GNSS anti jamming techniques have also been developed over the years to help combat jamming attempts. For example, some approaches use antenna arrays and digital signal processing techniques to try and block or suppress jamming signals at a receiver. Other approaches attempt to use non-GNSS signals or other non-GNSS information to identify a position of a receiver when GNSS signals are being jammed. However, it is difficult to integrate many of these approaches into portable devices or other devices, such as into portable M code-capable GPS receivers. Among other reasons, anti jamming GNSS receivers often have size, weight, power, and cost (SWaP-C) issues that can prevent their use in portable devices or other devices.

This disclosure provides various techniques for using at least one photonic integrated circuit (PIC) to perform operations in a GNSS receiver or other device or system. The photonic integrated circuit supports a multiband design for performing functions such as radio frequency (RF) signal demodulation. In some embodiments, a signal modulator can transfer an RF input signal onto an optical signal, and optical filters, optical switches, and/or other suitable optical components of the photonic integrated circuit can provide desired signal conditioning of the optical signal. Also, in some embodiments, a phase shifter and a wavelength division multiplexer (WDM) of the photonic integrated circuit can be used to help generate demodulated optical I and Q signals using the conditioned optical signal, and optical detectors or other components can convert the demodulated optical I and Q signals back into the RF domain. The results here include demodulated I and Q signals that correspond to the original RF input signal.

In some embodiments, the optical filters used in the photonic integrated circuit can include one or more optical filters dedicated or tuned for use with one or more specific frequencies or frequency ranges in a desired application. For example, the optical filters used in the photonic integrated circuit may include one or more optical filters dedicated or tuned for use with GPS or other GNSS signals, such as when designed to pass the L1 frequency (1575.42 MHz), the L2 frequency (1227.60 MHz), and the L5 frequency (1176 MHz) used in the GPS system. Also, in some embodiments, one, some, or all of the optical filters used in the photonic integrated circuit may be tunable to support I and Q demodulation of various signals, such as any signals falling with a wide frequency band (like from about 900 MHz to about 12 GHz, which includes the L, S, C, and X bands). Among other things, this allows use of the photonic integrated circuit to demodulate both GNSS-related signals and other signals received by a device or system that includes the photonic integrated circuit in a broad frequency band.

A photonic integrated circuit-based demodulator can achieve significantly reduced size, weight, power, and/or cost compared to many conventional demodulators. This enables use of photonic integrated circuit-based demodulators in mobile devices or other devices where size, weight, power, or cost issues may have otherwise prevented their use. Among other things, this can help with the integration of M code-capable GPS receivers into mobile devices or other devices. Also, photonic integrated circuit-based demodulators can be used to support functions that help to provide GNSS anti jamming capabilities, which may allow GNSS anti jamming functionality to be more easily integrated into mobile devices or other devices. Thus, the mobile devices or other devices may be less susceptible to jamming attempts while still satisfying any size, weight, power, and cost requirements applicable to those devices. In addition, the use of photonic integrated circuit-based demodulators can provide better electrical isolation between components, such as between an antenna and other electrical components.

It should be noted here that while one or more photonic integrated circuit-based demodulators are often described in this patent document as being used with particular devices like mobile devices or GNSS receivers, any number of photonic integrated circuit-based demodulators may be used with any suitable devices and in any suitable systems. Also, it should be noted here that while one or more photonic integrated circuit-based demodulators are often described in this patent document as being used in order to allow certain functions like GNSS anti jamming to be implemented in a device, any number of photonic integrated circuit-based demodulators may be used to support any suitable functionality in a device or system. There is no requirement here that a photonic integrated circuit-based demodulator be limited to use with a mobile device, be limited to use with a GNSS receiver, or be limited to use with GNSS anti-jamming.

Figure 1:
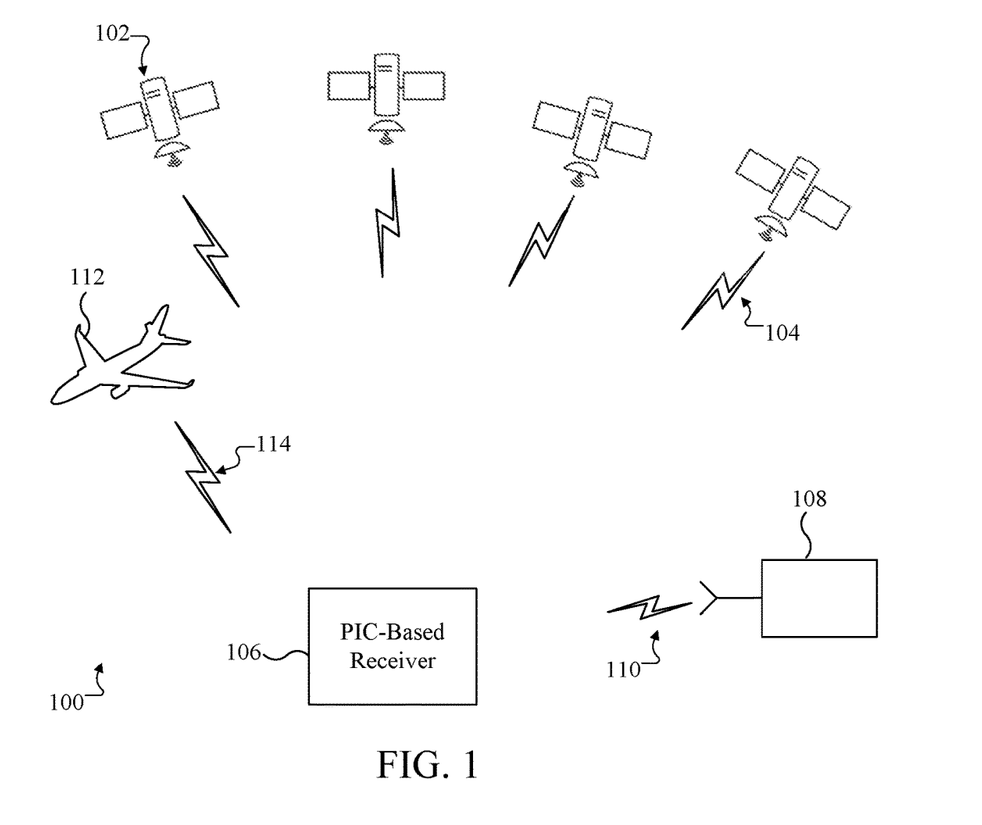
FIG. 1 illustrates an example global navigation satellite system (GNSS) according to this disclosure.

FIG. 1 illustrates an example GNSS 100 according to this disclosure. As shown in FIG. 1, the GNSS 100 includes multiple satellites 102, where the satellites 102 transmit wireless position signals 104. The satellites 102 here support any suitable satellite navigation system, such as the Global Positioning System (GPS), Global Navigation Satellite System (GLONASS), Galileo system, BeiDou system, or other global/regional system for navigation that uses a constellation of satellites (now known or later developed/deployed). Each satellite 102 includes any suitable structure configured to transmit position signals 104 from orbit.

The position signals 104 contain any suitable content. In some embodiments, for example, the position signals 104 transmitted by each satellite 102 include the current position of that satellite 102 and the current time held by an atomic clock on-board that satellite 102. As a particular example, the position signals 104 transmitted by each satellite 102 may include the current time of that satellite's atomic clock, ephemerides, and an almanac. Ephemerides very accurately describe the current positions of the satellites 102, but ephemerides are valid for shorter periods of time (such as four hours). The almanac coarsely describes the positions of the satellites 102 and therefore contains less-accurate orbital information than the ephemerides, but the almanac is valid for longer periods of time (such as up to 90 days). The almanac is often used to initially identify the approximate positions of the satellites 102, and the ephemerides are then used after that. Of course, any other or additional information may be included in the position signals 104.

As shown in this example, a PIC-based receiver 106 receives the position signals 104 from the satellites 102 and uses the position signals 104 to identify its geo-spatial location. For example, the PIC-based receiver 106 can use the information from the position signals 104 to perform trilateration, triangulation, or other signal processing technique, including those techniques now known or later developed, to identify its geo-spatial location. The PIC-based receiver 106 may be used in any number of devices or systems that operate based on or using the geo-spatial location of the receiver 106. For example, the receiver 106 may be used in civilian or military handheld devices or other portable devices, land vehicles (such as cars, trucks, and semi-trucks), autonomous vehicles (such as autonomous passenger vehicles, autonomous shuttles or buses, or other autonomous vehicles), ships or other vessels, or drones, aircraft, rockets, missiles, or other flight vehicles.

As shown in FIG. 1, the receipt and use of the position signals 104 by the receiver 106 can be affected by one or more adversaries or other illicit actors. For example, one or more transmitters 108 on the ground may be used to generate and transmit jamming signals 110, and/or one or more transmitters 112 in the air may be used to generate and transmit jamming signals 114. The jamming signals 110, 114 may be transmitted at the same frequencies as the position signals 104, which can drown out or jam successful receipt and use of the position signals 104 by the receiver 106. The jamming signals 110, 114 may be broadcast over a large area or targeted to a well-defined area or even to a specific device or system. Without anti jamming capabilities, the jamming signals 110, 114 can interfere with proper operation of the receiver 106 and may interfere with or prevent the receiver 106 from accurately identifying its position.

As described in more detail below, the PIC-based receiver 106 incorporates one or more PIC-based optical demodulators, which can be used (among other things) to demodulate and recover position signals 104 received by the receiver 106. The PIC-based optical demodulators can have reduced size, weight, power, and/or cost compared to conventional demodulators, which can reduce the size, weight, power, and/or cost of the receiver 106 or a device or system that includes the receiver 106. This can also or alternatively allow additional functionality to be incorporated into the receiver 106 or a device or system that includes the receiver 106. In some embodiments, for instance, this may make it easier to incorporate additional functionality like GNSS anti jamming into the receiver 106 or into the device or system that includes the receiver 106 while still satisfying all applicable size, weight, power, and cost requirements. In addition, the use of one or more PIC-based optical demodulators can provide improved electrical isolation between components in the receiver 106 or in the device or system that includes the receiver 106.

Although FIG. 1 illustrates one example of a GNSS 100, various changes may be made to FIG. 1. For example, any number of receivers 106 may be used with a GNSS 100. Also, the GNSS 100 may include any suitable number of satellites 102 in any suitable configuration, and the satellites 102 that are visible to any given receiver 106 at any specific time can vary. Further, depending on the circumstances, there may be any number of jamming transmitters on the ground or in the air for a given environment (including no jamming transmitters). In addition, the PIC-based receiver 106 may be used to receive and process any other or additional signals and is not limited to use with GNSS position signals.

Figure 2:
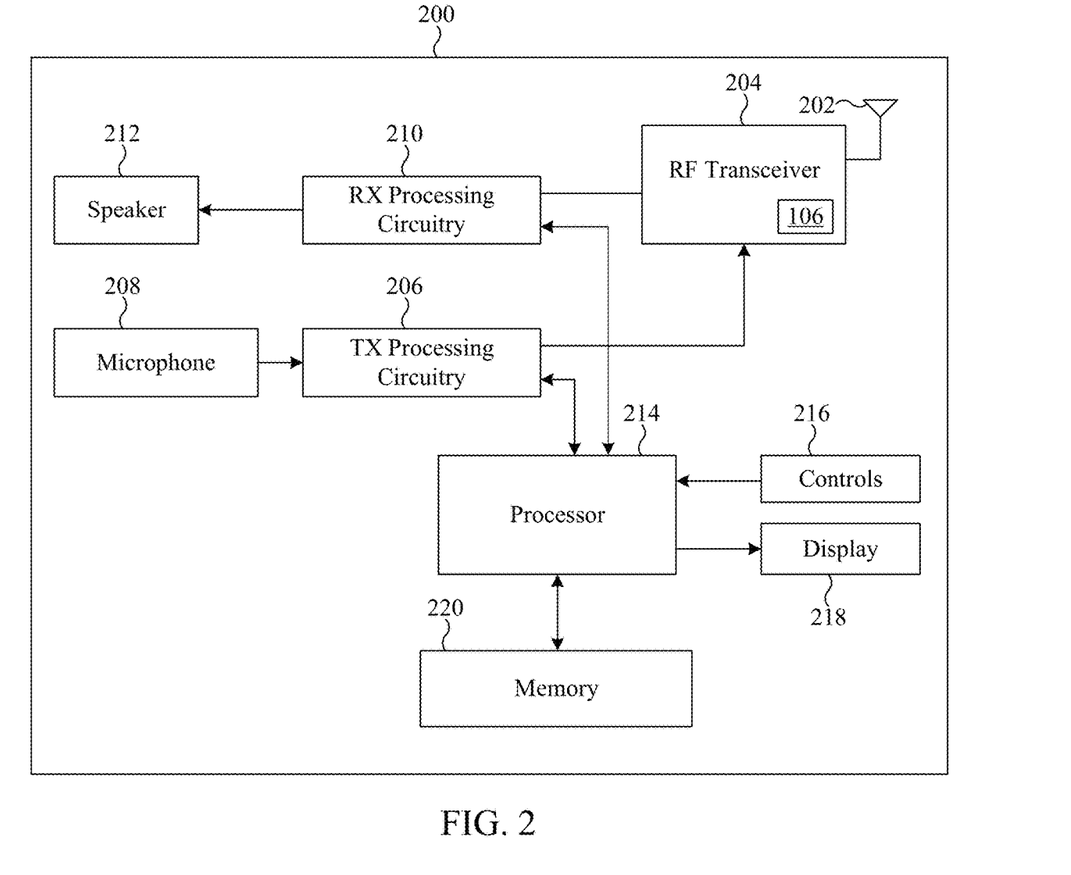
FIG. 2 illustrates an example device with a receiver supporting multiband photonic integrated circuit-based I and Q demodulation according to this disclosure.

FIG. 2 illustrates an example device 200 with a receiver supporting multiband PIC-based I and Q demodulation according to this disclosure. For ease of explanation, the device 200 shown in FIG. 2 may be described as representing a mobile device or other device that operates using the PIC-based receiver 106 in the GNSS 100 of FIG. 1. However, the device 200 may be used in any other suitable system and is not limited to use in a GNSS. Also, any other suitable device that incorporates a PIC-based receiver designed in accordance with this disclosure may be used in the GNSS 100 or in any other suitable system.

As shown in FIG. 2, the device 200 includes at least one antenna 202, at least one RF transceiver 204, transmit (TX) processing circuitry 206, at least one microphone 208, receive (RX) processing circuitry 210, and at least one speaker 212. The device 200 also includes at least one processor 214, one or more physical controls 216, at least one display 218, and at least one memory 220. Here, one or more PIC-based receivers 106 represent, are incorporated into, are used to implement, or are used along with the RF transceiver(s) 204.

The RF transceiver 204 receives, from the antenna 202, incoming RF signals, such as cellular, WiFi, BLUETOOTH, or GNSS signals. The RF transceiver 204 down-converts the incoming RF signals to generate intermediate frequency (IF) or baseband signals. As described in more detail below, as part of this process for one or more of the RF signals received by the antenna 202, at least one PIC-based optical demodulator can be used in at least one PIC-based receiver 106 to demodulate the RF signal(s) and possibly to perform other functions related to the RF signal(s). The IF or baseband signals are sent to the receive processing circuitry 210, which generates processed baseband signals by filtering, decoding, digitizing, and/or otherwise processing the baseband or IF signals. The receive processing circuitry 210 can transmit the processed baseband signals to the speaker 212 or to the processor 214 for further processing.

The transmit processing circuitry 206 receives analog or digital data from the microphone 208 or other outgoing baseband data from the processor 214. The transmit processing circuitry 206 encodes, multiplexes, digitizes, and/or otherwise processes the outgoing baseband data to generate processed baseband or IF signals. The RF transceiver 204 receives the outgoing processed baseband or IF signals from the transmit processing circuitry 206 and up-converts the baseband or IF signals to RF signals that are transmitted via the antenna 202.

Each antenna 202 includes any suitable structure configured to transmit RF signals and/or receive RF signals. In some embodiments, an antenna 202 may represent an antenna array having multiple antenna elements arranged in a desired pattern. Each transceiver 204 includes any suitable structure configured to generate outgoing RF signals for transmission and/or process incoming RF signals. Note that while shown as an integrated device, a transceiver 204 may be implemented using a transmitter and a separate receiver. The transmit processing circuitry 206 includes any suitable structure configured to encode, multiplex, digitize, or otherwise process data to generate signals containing the data. Each microphone 208 includes any suitable structure configured to capture audio signals. The receive processing circuitry 210 includes any suitable structure configured to filter, decode, digitize, or otherwise process signals to recover data from the signals. Each speaker 212 includes any suitable structure configured to generate audio signals. Note that if the device 200 only supports one-way communication, a transceiver 204 may be replaced with either a transmitter or a receiver, and either the transmit processing circuitry 206 or the receive processing circuitry 210 can be omitted.

The processor 214 include one or more processors or other processing devices and execute an operating system, applications, or other logic stored in the memory 220 in order to control the overall operation of the device 200. For example, the processor 214 can control the transmission, reception, and processing of signals by the RF transceiver 204, the receive processing circuitry 210, and the transmit processing circuitry 206 in accordance with well-known principles. The processor 214 is also configured to execute other processes and applications resident in the memory 220, and the processor 214 can move data into or out of the memory 220 as required by an executing application. In some embodiments, the processor 214 can perform functions related to GNSS signals that are received by the device 200. For instance, the processor 214 may determine a geo-location of the device 200 (or receive the geo-location of the device 200 from the receiver 106) and display the geo-location or use the geo-location in some other manner. The processor 214 may also perform anti-jamming, anti-spoofing, or other functions associated with the GNSS signals. The processor 214 includes any suitable processing device or devices, such as one or more microprocessors, microcontrollers, digital signal processors (DSPs), application specific integrated circuits (ASICs), field programmable gate arrays (FPGAs), or discrete circuitry.

The processor 214 is coupled to the physical controls 216 and the display 218. A user of the device 200 can use the physical controls 216 to invoke certain functions, such as powering on or powering off the device 200 or controlling a volume of the device 200. The display 218 may be a liquid crystal display (LCD), light emitting diode (LED) display, organic light emitting diode (OLED) display, quantum light emitting diode (QLED) display, or other display configured to render text and graphics. If the display 218 denotes a touchscreen configured to receive touch input, fewer or no physical controls 216 may be needed in the device 200.

The memory 220 is coupled to the processor 214. The memory 220 stores instructions and data used, generated, or collected by the processor 214 or by the device 200. In some embodiments, part of the memory 220 can include a random access memory, and another part of the memory 220 can include a Flash memory or other read-only memory. Each memory 220 includes any suitable volatile or non-volatile structure configured to store and facilitate retrieval of information.

Although FIG. 2 illustrates one example of a device 200 with a receiver 106 supporting multiband photonic integrated circuit-based I and Q demodulation, various changes may be made to FIG. 2. For example, various components in FIG. 2 can be combined, further subdivided, replicated, rearranged, or omitted and additional components can be added according to particular needs. As a particular example, the processor 214 may be divided into multiple processors, such as one or more central processing units (CPUs) and one or more graphics processing units (GPUs). As another example, components such as a microphone 208 and speaker 212 may not be needed. Also, devices and systems that perform I and Q demodulation come in a wide variety of configurations, and FIG. 2 does not limit this disclosure to any particular device or system. The PIC-based demodulation described in this patent document can be used in any suitable device or system, regardless of whether the demodulation is performed using GNSS-based RF signals.

Figure 3:
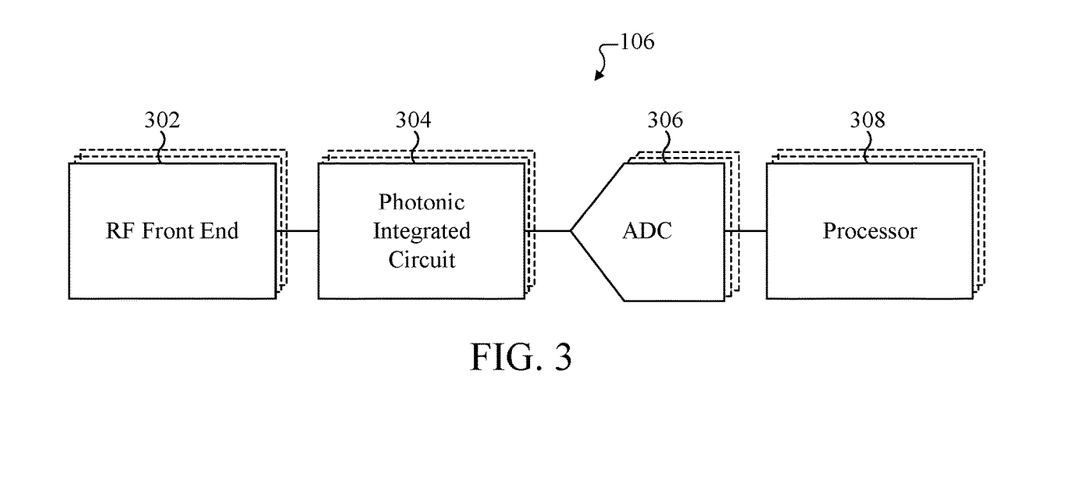
FIG. 3 illustrates an example receiver supporting multiband photonic integrated circuit-based I and Q demodulation according to this disclosure.

FIG. 3 illustrates an example receiver 106 supporting multiband PIC-based I and Q demodulation according to this disclosure. For ease of explanation, the receiver 106 shown in FIG. 3 may be described as being used in the device 200 of FIG. 2 within the GNSS 100 of FIG. 1. However, the receiver 106 may be used in any suitable device, regardless of whether that device is a portable device or other device that includes the components shown in FIG. 2. Also, the receiver 106 may be used in any suitable system, regardless of whether that system is a GNSS or other navigation system.

As shown in FIG. 3, the receiver 106 includes at least one RF front end 302, at least one photonic integrated circuit 304, at least one analog-to-digital converter (ADC) 306, and at least one processor 308. Each RF front end 302 generally operates to obtain one or more RF signals, pre-process the RF signals as needed or desired, and provide the pre-processed RF signals for use by the photonic integrated circuit 304. The one or more RF signals can be obtained by each RF front end 302 from any suitable source(s), such as from one or more antennas 202 or via a wired connection. Also, any suitable pre-processing of the one or more RF signals can be performed by each RF front end 302, such as filtering and/or amplifying an RF signal. Each RF front end 302 includes any suitable structure configured to generate, receive, or otherwise obtain one or more RF signals.

Each photonic integrated circuit 304 receives one or more RF signals from at least one RF front end 302, converts the one or more RF signals into one or more optical signals, and processes the one or more optical signals. For example, as described in more detail below, at least one photonic integrated circuit 304 includes components configured to perform optical I and Q demodulation of one or more RF signals, which results in I and Q demodulated optical signals. The I and Q demodulated optical signals are then converted back into the RF domain, such as by generating separate I and Q RF electrical signals. Each photonic integrated circuit 304 includes any suitable structure configured to process one or more optical signals.

The ADC 306 converts the electrical I and Q demodulated signals output by the photonic integrated circuit(s) 304 from the analog domain to the digital domain. For example, the ADC 306 can sample the electrical signals output by the photonic integrated circuit(s) 304 and generate streams of eight-bit, sixteen-bit, twenty four-bit, or other digital data values representing the electrical signals. The ADC 306 can often be controlled (such as by a processor 214, 308 or other component) to control the rate at which the ADC 306 produces the digital values. The ADC 306 includes any suitable structure configured to generate digital values representing analog signals.

The processor 308 processes the digitized outputs of the one or more ADCs 306 to provide some desired functionality in a device or system. For example, in a GNSS receiver, the processor 308 may process digitized I and Q demodulated signals corresponding to multiple position signals 104 in order to identify a geo-location of the receiver 106. In other embodiments, the processor 308 may perform other functions based on the I and Q demodulated signals. The processor 308 includes any suitable processing device or devices, such as one or more microprocessors, microcontrollers, DSPs, ASICs, FPGAs, or discrete circuitry. Depending on the embodiment, the processor 308 may be used only to process the digitized I and Q demodulated signals or to perform other functions. For that reason, the processor 308 may or may not represent a processor used in a larger device or system. For instance, the processor 308 may or may not represent the processor 214 in the device 200.

Note that while a single RF front end 302, a single photonic integrated circuit 304, a single ADC 306, and a single processor 308 are shown in solid form in FIG. 3, the receiver 106 may include multiple instances of one, some, or all of these components. For example, when used in a GNSS receiver, the GNSS receiver may receive a large number of position signals 104, and an RF front end 302, a photonic integrated circuit 304, and an ADC 306 may be used to process each one of the position signals 104. As another example, the receiver 106 may receive one or more RF signals (instead of or in addition to the position signals 104), and an RF front end 302, a photonic integrated circuit 304, and an ADC 306 may be used for each of the different received signals. This helps to support or permit multi-channel operation of a device or system that incorporates the receiver 106. In some embodiments, for instance, a device may support up to eight different channels and include eight RF front ends 302, eight photonic integrated circuits 304, and eight ADCs 306, although other numbers of channels can also be used.

Although FIG. 3 illustrates one example of a receiver 106 supporting multiband PIC-based I and Q demodulation, various changes may be made to FIG. 3. For example, various components in FIG. 3 can be combined, further subdivided, replicated, rearranged, or omitted and additional components can be added according to particular needs. Also, at least one photonic integrated circuit 304 that implements at least one PIC-based optical demodulator can be used in any other suitable device or system, regardless of whether the demodulation is used with GNSS-based signals.

Figure 4:
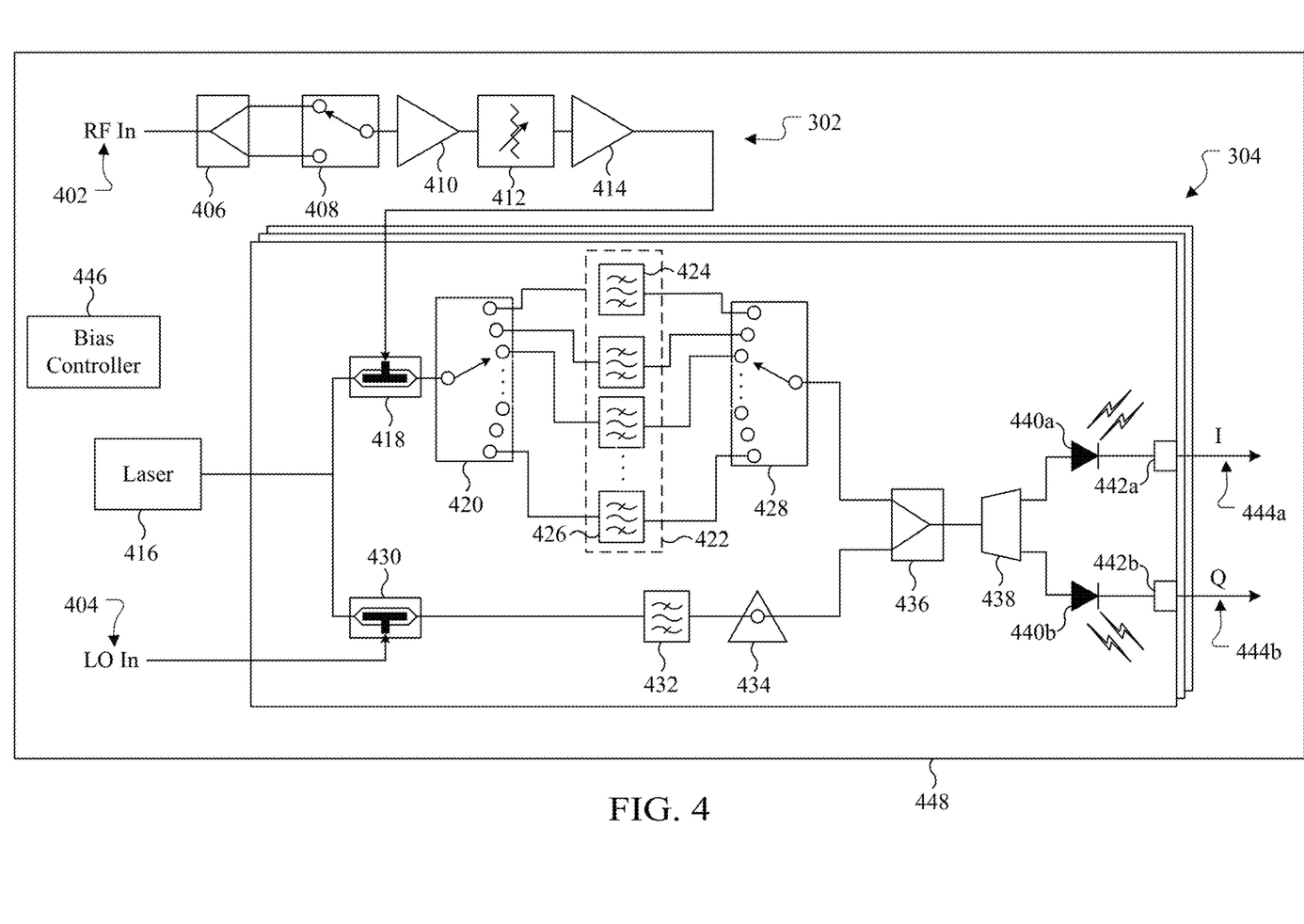
FIGS. 4 and 5 illustrate example multiband photonic integrated circuits supporting I and Q demodulation according to this disclosure.
Figure 5:
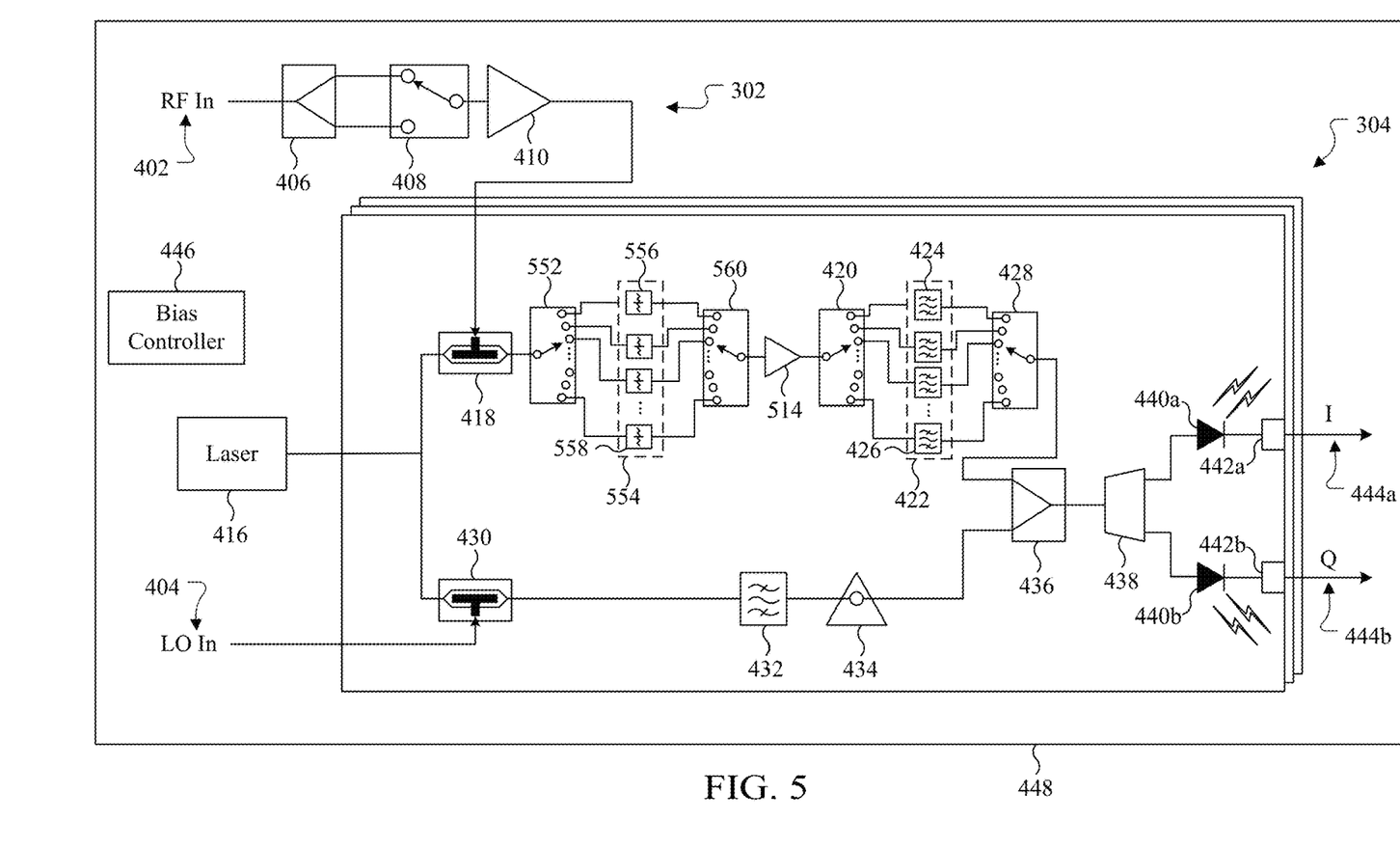

FIGS. 4 and 5 illustrate example multiband photonic integrated circuits 304 supporting I and Q demodulation according to this disclosure. For ease of explanation, the photonic integrated circuits 304 shown in FIGS. 4 and 5 may be described as being used in the receiver 106 of FIG. 3 in the device 200 of FIG. 2 within the GNSS 100 of FIG. 1. However, the photonic integrated circuits 304 may be used in any other suitable devices and in any other suitable systems.

As shown in FIG. 4, an RF input signal 402 and a local oscillator (LO) input signal 404 are received and processed. The RF input signal 402 can be received from any suitable source, such as an antenna 202 or a wired connection. The LO input signal 404 can also be received from any suitable source, such as a local clock source or other LO source. The RF input signal 402 is pre-processed in an RF front end 302, which in this example includes a diplexer 406, an RF switch 408, an amplifier 410, a variable RF attenuator 412, and a power amplifier 414. The diplexer 406 operates to separate or split the RF input signal 402 based on different frequencies. This may allow, for instance, the diplexer 406 to separate and provide one portion of the RF input signal 402 in a first frequency range to one input of the RF switch 408 and to provide another portion of the RF input signal 402 in a second frequency range to another input of the RF switch 408. The diplexer 406 includes any suitable structure configured to separate frequencies of an RF input signal 402.

The RF switch 408 selectively provides one of its inputs to the amplifier 410. The RF switch 408 may be controlled, such as by the processor 214 or 308, based on the frequency range to be provided to the photonic integrated circuit(s) 304. The RF switch 408 includes any suitable structure configured to selectively provide one of multiple input signals, such as a single-pole double-throw (SPDT) switch. The amplifier 410 amplifies the signal received from the RF switch 408. The amplifier 410 includes any suitable structure configured to amplify an RF signal, such as a low noise amplifier (LNA). The variable RF attenuator 412 can be used to adjust the amplified output from the amplifier 410 so that the amplified output is at a desired level. The variable RF attenuator 412 includes any suitable structure configured to provide a controllable attenuation for an RF signal. The power amplifier 414 amplifies the output from the variable RF attenuator 412 to produce an RF input to the photonic integrated circuit(s) 304. The power amplifier 414 includes any suitable structure configured to amplify an RF signal.

Note that while the same RF front end 302 in this example provides an RF input to multiple photonic integrated circuits 304, this need not be the case. In other embodiments, for example, each of multiple photonic integrated circuits 304 may have its own RF front end 302, and those RF front ends 302 may or may not be identical. It should also be noted that a single frequency range or more than two frequency ranges may be supported here, in which case the diplexer 406 and switch 408 may be omitted or may be expanded to support additional frequency ranges.

As shown in FIG. 4, at least one laser 416 provides one or more optical signals to the photonic integrated circuit(s) 304. While a single laser 416 is shown here as being used with multiple photonic integrated circuits 304, other embodiments may use different lasers 416 with different photonic integrated circuits 304. Each laser 416 includes any suitable structure configured to generate an optical signal, such as one or more laser diodes.

The photonic integrated circuit 304 in this example includes a first RF modulator 418, which receives the amplified RF output from the power amplifier 414 and at least part of an optical signal from the laser 416. The first RF modulator 418 modulates the optical signal from the laser 416 based on the amplified RF output from the power amplifier 414 in order to modulate the RF signal onto the optical signal. The first RF modulator 418 includes any suitable structure configured to modulate an optical signal based on an input signal.

The modulated optical signal from the first RF modulator 418 is provided to a first optical switch 420, which selectively provides the modulated optical signal to one of multiple outputs. The outputs of the first optical switch 420 are coupled to an optical filter bank 422, which includes at least one optical filter 424 and/or one or more optical filters 426. Each optical filter 424, 426 is configured to receive an optical signal and to filter the optical signal. Different optical filters 424, 426 can be designed or tuned to filter out different frequencies or frequency ranges, thereby permitting operation of the photonic integrated circuit 304 over a wider frequency band.

In some embodiments, the at least one optical filter 424 can be dedicated or tuned to operate specifically at one or more frequencies or frequency ranges for a specific application, thus functioning as one or more dedicated optical filters. For instance, at least one optical filter 424 may represent one or more narrowband filters designed or tuned to pass frequencies at or near the L1, L2, and L5 frequencies used in the GPS system (or other signals used in other GNSSs) and to filter out all other frequencies. Of course, the specific frequencies or frequency ranges can vary based on the application. The one or more optical filters 426 may be dedicated or tuned to support reception of signals at other frequencies or frequency ranges, such as non-GNSS frequencies. As a particular example, different optical filters 426 may be designed or tunable over different frequency ranges to provide coverage for all or various subsets of frequencies from about 900 MHz to about 12 GHz. Note that the distinction between the optical filters 424 and 426 may not be needed if, for instance, one or more tunable optical filters 426 can be tuned to the frequencies or frequency ranges used by the at least one optical filter 424. Thus, the filter bank 422 may include at least one optical filter 424 and/or one or more optical filters 426.

The optical filter bank 422 may include any suitable number of optical filters 424, 426. Each optical filter 424, 426 includes any suitable structure configured to filter an optical signal, such as a ring resonator filter, microdisk filter, or other optical waveguide filter. In some embodiments, at least one of the optical filters 424, 426 is tunable in order to alter the frequencies or frequency ranges allowed to pass through the filter. This may allow, for example, the same photonic integrated circuit 304 to be used to demodulate signals at various frequencies or frequency ranges. In particular embodiments, the at least one optical filter 424 may be fixed and non-tunable and be used to isolate GNSS-related signals, and the one or more optical filters 426 may be tunable and used to isolate other signals.

The outputs of the optical filters 424, 426 are coupled to a second optical switch 428, which selectively provides the filtered optical signal from one of the optical filters 424, 426 to its output. The optical switches 420, 428 allow the modulated optical signal from the RF modulator 418 to be selectively filtered by one of the optical filters 424, 426 and then output for further processing. Each optical switch 420, 428 includes any suitable structure configured to selectively route an optical signal, such as a single-pole X-throw (SPXT) optical switch (where X denotes the number of outputs of the switch 420 or the number of inputs of the switch 428). Note, however, that the use of the optical switches 420, 428 and the optical filters 426 may be omitted if the photonic integrated circuit 304 is designed for use with one or more specific frequencies or frequency bands so that the switching of optical filters is not needed.

To support photonic I and Q demodulation of the RF input signal 402, the LO input signal 404 is similarly provided to a second RF modulator 430, which also receives at least part of an optical signal from the laser 416. The second RF modulator 430 modulates the optical signal from the laser 416 based on the LO input signal 404 in order to modulate the LO signal onto the optical signal. The second RF modulator 430 includes any suitable structure configured to modulate an optical signal based on an input signal. The modulated LO optical signal is provided to an optical filter 432, which filters the modulated LO optical signal. The optical filter 432 includes any suitable structure configured to filter an optical signal, such as a waveguide optical filter. In some embodiments, the optical filter 432 is tunable in order to alter the frequencies or frequency ranges allowed to pass through the filter 432. The filtered LO optical signal is provided to a phase shifter 434, which shifts the phase of the filtered LO optical signal as needed relative to the RF optical signal in order to achieve proper demodulation of the RF input signal 402. The phase shifter 434 includes any suitable structure configured to shift the phase of an optical signal.

An optical coupler 436 receives the filtered RF optical signal from the optical switch 428 and the filtered and phase-shifted LO optical signal from the phase shifter 434. The optical coupler 436 combines the two optical signals onto the same optical path and provides the combined optical signal to a wavelength division multiplexer (WDM) 438. The optical coupler 436 includes any suitable structure configured to combine optical signals, such as a diplexer operating in the opposite manner as the diplexer 406. The wavelength division multiplexer 438 separates wavelengths of the combined input optical signal to produce two optical outputs, which are respectively provided to two optical detectors 440a-440b. These optical outputs represent components of an optical demodulated version of the RF input signal 402. The wavelength division multiplexer 438 includes any suitable structure configured to route optical signals based on wavelength.

Each optical detector 440a-440b converts an incoming optical signal into a corresponding electrical signal. Thus, each optical detector 440a-440b effectively converts one demodulated optical component corresponding to the RF input signal 402 from the optical domain back into the RF domain. Each optical detector 440a-440b includes any suitable structure configured to convert an optical signal to an electrical signal, such as a germanium (Ge) photodetector or other suitable photodetector. Output ports 442a-442b provide the two electrical signals, which represent I and Q demodulated output signals 444a-444b, from the photonic integrated circuit 304. For instance, the output ports 442a-442b may provide the I and Q demodulated output signals 444a-444b to at least one ADC 306 for further processing.

A bias controller 446 controls the operation of the laser 416. For example, the bias controller 446 can control a bias signal that is provided to the laser 416 in order control the wavelength(s) of the optical signal(s) generated by the laser 416. The bias controller 446 includes any suitable structure configured to control operation of a laser, such as a microcontroller. Note that, depending on the implementation, the bias controller 446 may represent a stand-alone component or may be integrated into or implemented using another component, such as the processor 214 or 308.

In some embodiments, the various components shown in FIG. 4 may be implemented on or otherwise carried by a circuit card assembly 448, which may represent a printed circuit board or other substrate on which other components such as the RF front end(s) 302 and the photonic integrated circuit(s) 304 are mounted or formed. Note, however, that the various components shown in FIG. 4 may be implemented in any other suitable manner.

As can be seen here, the photonic integrated circuit 304 operates to optically demodulate an RF input signal 402 and produce I and Q demodulated output signals 444a-444b. The I and Q demodulated output signals 444a-444b can be further processed in order to recover data contained in the RF input signal 402, to facilitate with geo-location of a receiver 106, or to perform other functions. As noted earlier, there may be multiple instances of the photonic integrated circuit 304 operating in a given device. This allows, for example, different photonic integrated circuits 304 to be used to simultaneously process different GNSS or other RF signals received by the photonic integrated circuits 304. As a particular example, this may allow different photonic integrated circuits 304 to be used to process and recover different position signals 104 simultaneously. Note, however, that a single photonic integrated circuit 304 may also be used in a device or system. Also, note that different photonic integrated circuits 304 in a device or system may have different designs and need not be identical.

In the example shown in FIG. 4, the photonic integrated circuit 304 is used to perform signal demodulation only. However, one or more additional functions can also be incorporated into and performed using a photonic integrated circuit 304. For example, as shown in FIG. 5, at least part of the signal conditioning functions that had been performed in the RF front end 302 to the RF input signal 402 can be performed optically in at least one of the one or more photonic integrated circuits 304. In the example shown in FIG. 5, the RF front end 302 includes the diplexer 406, RF switch 408, and amplifier 410 (although as noted above the diplexer 406 and RF switch 408 may not be needed). The amplified RF output of the amplifier 410 is provided to the RF modulator 418 and modulated onto an optical signal as described above.

In FIG. 5, the photonic integrated circuit 304 includes additional components that perform signal conditioning prior to demodulation. In particular, the photonic integrated circuit 304 includes a third optical switch 552, an optical attenuator bank 554 having at least one optical attenuator 556 and one or more optical attenuators 558, and a fourth optical switch 560. The third optical switch 552 selectively provides the RF modulated optical signal from the RF modulator 418 to one of the optical attenuators 556, 558, and the fourth optical switch 560 selectively provides an attenuated version of the RF modulated optical signal from that optical attenuator 556, 558 to an optical amplifier 514. The different optical attenuators 556, 558 can provide different amounts of attenuation to the RF modulated optical signal received from the RF modulator 418. Each optical attenuator 556, 558 includes any suitable structure configured to provide attenuation for an optical signal. The specific optical attenuator 556, 558 selected using the switches 552 and 560 can vary based on, for example, the type of RF input signal 402 being processed. For instance, the at least one optical attenuator 556 may be designed specifically for use with GNSS position signals 104, while the one or more optical attenuators 558 may be designed for use with other RF signals. Note that one, some, or all of the optical attenuators 556, 558 may be variable, or all of the optical attenuators 556, 558 may provide fixed attenuation. Also note that the distinction between the optical attenuators 556 and 558 may not be needed if, for instance, one or more tunable optical attenuators 558 can be tuned to the attenuation used by the at least one optical attenuator 556. Thus, the attenuator bank 554 may include at least one optical attenuator 556 and/or one or more optical attenuators 558.

The amplifier 514 is used here to optically amplify the attenuated signal provided via the optical switch 560. The amplified optical signal is provided to the first optical switch 420 for demodulation in the same manner described above. In this way, at least part of the signal conditioning of the RF input signal 402 can be performed optically within the photonic integrated circuit 304. The amplifier 514 includes any suitable structure configured to amplify an optical signal, such as a silicon optical amplifier.

There are various ways in which the components shown in FIGS. 4 and 5 can be fabricated or implemented. For example, at least some of the components (such as the optical filters, optical switches, and optical waveguides between components) may be fabricated using silicon nitride (SiN), which provides low loss and allows standard material processing operations to occur. If necessary, other components (such as the laser and RF modulators) can be fabricated separately and bonded or otherwise coupled to the silicon nitride components. As another example, at least some of the components (such as the laser and/or RF modulators) may be fabricated using indium phosphide (InP) or lithium niobate (LiNbO3). Other components (such as the optical filters, optical switches, and/or waveguides between components) may also be fabricated using indium phosphide or lithium niobate, allowing most or all components to be fabricated together. As yet another example, a multi-material PIC can be fabricated, such as where indium phosphide or lithium niobate is used to fabricate the RF modulators and the laser and silicon nitride used to fabricate the optical filters, optical switches, and waveguides between components. However, these are merely examples, and the various components shown in FIGS. 4 and 5 may be formed in any suitable manner (whether integrally or separate) using any suitable material(s) (whether common or different).

Although FIGS. 4 and 5 illustrate examples of multiband photonic integrated circuits 304 supporting I and Q demodulation, various changes may be made to FIGS. 4 and 5. For example, various components in FIGS. 4 and 5 can be combined, further subdivided, replicated, rearranged, or omitted and additional components can be added according to particular needs. As noted above, for instance, a photonic integrated circuit 304 may be designed for use at a single frequency or frequency band, and various components like the optical switches and additional optical filters and optical attenuators may be omitted. Also, each RF front end 302 may be implemented in any other suitable manner. In addition, each photonic integrated circuit 304 may include any additional components in order to optically implement any additional functionality. Given that, the demodulated I and Q optical signals produced by the wavelength division multiplexer 438 may be further processed optically prior to conversion back into the electrical domain.

Figure 6:
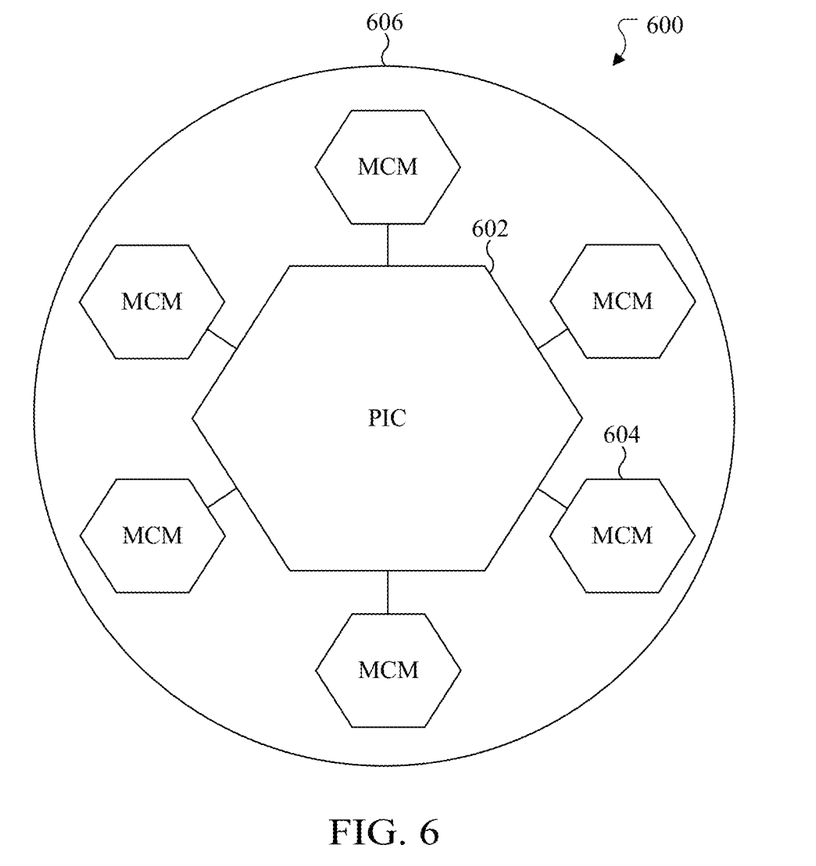
FIG. 6 illustrates an example layout of a receiver supporting multiband photonic integrated circuit-based I and Q demodulation according to this disclosure.

FIG. 6 illustrates an example layout 600 of a receiver supporting multiband photonic integrated circuit-based I and Q demodulation according to this disclosure. For ease of explanation, the layout 600 shown in FIG. 6 may be described as being used for the receiver 106 of FIG. 3. However, a device supporting PIC-based I and Q demodulation may have any other suitable layout.

As shown in FIG. 6, the layout 600 includes a photonic integrated circuit 602 coupled to at least one multi-chip module (MCM) 604. The photonic integrated circuit 602 implements photonic I and Q demodulation of one or more RF signals. For example, the photonic integrated circuit 602 may represent one or more instances of the photonic integrated circuit 304 described above. The at least one multi-chip module 604 may be used to support other functions associated with the photonic integrated circuit 602. For instance, the at least one multi-chip module 604 may include or implement one or more RF front ends 302 and one or more ADCs 306 (and possibly one or more processors 308). The at least one multi-chip module 604 may also include or implement one or more components of a larger device or system, such as the device 200. These other components may be implemented using a single multi-chip module 604 or using multiple multi-chip modules 604. Note that while six multi-chip modules 604 are shown as residing generally evenly around the photonic integrated circuit 602, any suitable number of multi-chip modules 604 can be arranged in any suitable manner relative to one or more photonic integrated circuits 602.

In some embodiments, the photonic integrated circuit(s) 602 and the multi-chip module(s) 604 are formed on, mounted on, carried by, or otherwise supported by a base 606. The base 606 may represent a substrate used only with the photonic integrated circuit(s) 602 and the multi-chip module(s) 604, or the base 606 may be used to carry other components. For instance, the base 606 may represent a semiconductor substrate in or on which other semiconductor devices, such as integrated circuit chips, resistors, capacitors, inductors, transistors, or other components are used. In particular embodiments, the base 606 represents a dielectric material on which is formed electrical connectors. The electrical connectors can be used to transport electrical signals to, from, and between the photonic integrated circuit(s) 602 and the multi-chip module(s) 604. An additional dielectric layer may be formed over the base 606 around the photonic integrated circuit(s) 602 and the multi-chip module(s) 604 in order to protect those components.

The overall size of the package formed using the layout 600 can vary based on the implementation. In some embodiments, for example, the photonic integrated circuit 602 may have a width of about 0.86 inches (about 21.8 millimeters), and each multi-chip module 604 may have a width of about 0.31 inches (about 7.9 millimeters). Given these dimensions, it is possible to fabricate the layout shown in FIG. 6 in a package that is about two inches (about 50.8 millimeters) in diameter and about one inch (25.4 millimeters) in height. Of course, these dimensions are for illustration only, and other relative sizes and dimensions for the individual components of the layout 600 and for the overall layout 600 may be obtained (particularly as component sizes continue to decrease over time). For instance, the overall size of the package can vary based on the number of photonic integrated circuits 602 and the number of multi-chip modules 604, as well as the arrangement of those components.

Although FIG. 6 illustrates one example of a layout 600 of a receiver supporting multiband photonic integrated circuit-based I and Q demodulation, various changes may be made to FIG. 6. For example, a receiver supporting multiband photonic integrated circuit-based I and Q demodulation may be implemented in any other suitable manner. Also, the specific sizes, dimensions, and arrangements shown in FIG. 6 are for illustration only.

Figure 7:
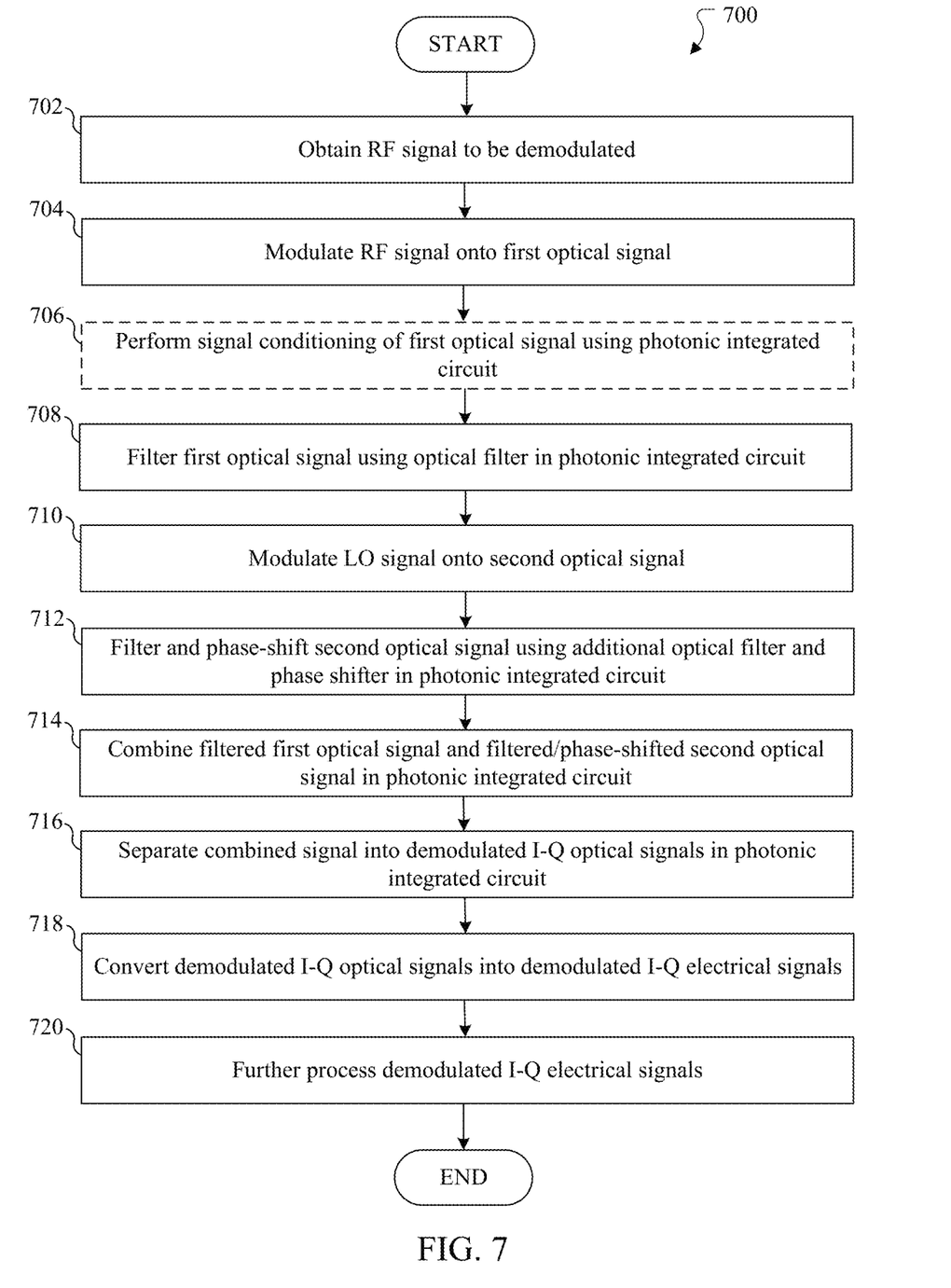
FIG. 7 illustrates an example method for I and Q demodulation using a multiband photonic integrated circuit according to this disclosure.

FIG. 7 illustrates an example method 700 for I and Q demodulation using a multiband photonic integrated circuit according to this disclosure. For ease of explanation, the method 700 shown in FIG. 7 may be described as being performed using the photonic integrated circuit 304 of FIG. 4 or 5 in the receiver 106 of FIG. 3. However, the method 700 may be used with any other suitable photonic integrated circuit designed in accordance with this disclosure and with any other suitable devices or systems.

As shown in FIG. 7, an RF signal to be demodulated is obtained at step 702. This may include, for example, receiving a (possibly pre-processed) RF signal from an RF front end 302. As a particular example, this may include receiving a pre-processed version of the RF input signal 402, after the RF input signal 402 has passed through the diplexer 406, optical switch 408, and amplifier 410 (and possibly through the attenuator 412 and amplifier 414). The RF signal is modulated onto a first optical signal at step 704. This may include, for example, the RF modulator 418 receiving the RF signal to be demodulated and at least part of an optical signal from the laser 416. This may also include the RF modulator 418 modulating the optical signal from the laser 416 based on the RF signal to be demodulated.

Optionally, the first optical signal may undergo signal conditioning in a photonic integrated circuit at step 706. This may include, for example, the optical switch 552 in the photonic integrated circuit 304 providing the first optical signal to at least one selected optical attenuator 556, 558 and the optical switch 560 receiving the attenuated first optical signal. The particular optical attenuator(s) 556, 558 used here can vary based on any suitable factors, such as the type of signal being demodulated. This step is optional since, as noted above, this portion of the signal conditioning may be performed using the RF input signal 402 prior to receipt by the RF modulator 418.

The first optical signal is filtered in the photonic integrated circuit at step 708. This may include, for example, the optical switch 420 in the photonic integrated circuit 304 providing the first optical signal to at least one selected optical filter 424, 426 and the optical switch 428 receiving the filtered first optical signal. The particular optical filter(s) 424, 426 used here can vary based on any suitable factors, such as the type of signal being demodulated. As a particular example, for a GNSS position signal 104, the first optical signal may be provided to one or more optical filters 424 dedicated or tuned to the particular frequencies or frequency ranges of the GNSS, such as the L1, L2, and L5 frequencies used in GPS. For other signals, the first optical signal may be provided to one or more optical filters 426 dedicated or tuned to the particular frequencies or frequency ranges for other applications. In some cases, the optical filters 426 may operate across a wide frequency range, such as from about 900 MHz to about 12 GHz, while the optical filter(s) 424 may be narrowband and designed to operate in a specific application (like GNSS reception).

An LO signal is modulated onto a second optical signal at step 710. This may include, for example, the RF modulator 430 receiving the LO input signal 404 and at least part of an optical signal from the laser 416. This may also include the RF modulator 430 modulating the optical signal from the laser 416 based on the LO input signal 404. The second optical signal is filtered and phase-shifted using an additional optical filter and a phase shifter in the photonic integrated circuit at step 712. This may include, for example, the optical filter 432 filtering the second optical signal and the phase shifter 434 shifting the phase of the second optical signal. The optical filter 432 may be dedicated or tuned to a specific frequency or frequency range needed to demodulate the RF input signal 402, or the optical filter 432 may be tunable across all possible frequencies that might be needed for demodulation. The phase shifter 434 can shift the phase of the second optical signal as needed to align with the first optical signal for proper demodulation.

The filtered first optical signal and the filtered and phase-shifted second optical signal are combined in the photonic integrated circuit at step 714. This may include, for example, the optical coupler 436 combining the output of the optical switch 428 and the output of the phase shifter 434. The combined signal is separated into demodulated I and Q optical signals in the photonic integrated circuit at step 716. This may include, for example, the wavelength division multiplexer 438 separating the combined optical signal that is output from the optical coupler 436 by wavelength. The demodulated I and Q optical signals are converted into demodulated I and Q electrical signals at step 718. This may include, for example, the optical detectors 440a-440b converting the optical outputs from the wavelength division multiplexer 438 into corresponding electrical signals, which represent I and Q demodulated output signals 444a-444b.

The demodulated I and Q electrical signals are further processed as needed to perform a desired function or functions at step 720. This may include, for example, the I and Q demodulated output signals 444a-444b being provided through the output ports 442a-442b to one or more other components for further processing. As a particular example, the I and Q demodulated output signals 444a-444b may be provided to one or more ADCs 306 for digital conversion, and the resulting digital values can be processed using a processor 308 or 214, such as to perform geo-location.

Although FIG. 7 illustrates one example of a method 700 for I and Q demodulation using a multiband photonic integrated circuit, various changes may be made to FIG. 7. For example, while shown as a series of steps, various steps in FIG. 7 can overlap, occur in parallel, occur in a different order, or occur any number of times. As a particular example, steps 702-708 can generally overlap or occur in parallel with steps 710-712. Also, the method 700 may be performed using multiple photonic integrated circuits (possibly simultaneously) to demodulate multiple RF input signals, such as multiple GNSS position signals 104 and/or other signals.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document.

The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a first modulator configured to modulate a radio frequency (RF) input signal onto a first optical signal;
a second modulator configured to modulate a local oscillator (LO) signal onto a second optical signal; and
a photonic integrated circuit comprising an optical demodulator configured to generate, using the first and second modulated optical signals, I and Q signals representing a demodulated version of the RF input signal,
wherein the optical demodulator comprises:
an optical filter bank comprising multiple optical filters, wherein different ones of the optical filters are configured to pass different frequencies or frequency ranges;
a first optical switch configured to selectively provide the first modulated optical signal to a selected one of the optical filters; and
a second optical switch configured to receive a filtered first optical signal from the selected one of the optical filters.

2. The apparatus of claim 1, wherein the first and second modulators form part of the photonic integrated circuit.

3. The apparatus of claim 1, wherein the multiple optical filters comprise at least one of:
at least one narrowband optical filter; and
one or more tunable optical filters.

4. The apparatus of claim 3, wherein:
the at least one narrowband optical filter is configured to isolate global navigation satellite system-related signals; and
the one or more tunable optical filters are configured to isolate signals over a frequency range of about 900 MHz to about 12 GHz.

5. The apparatus of claim 1, wherein the optical demodulator further comprises:
an additional optical filter configured to filter the second optical signal; and
a phase shifter configured to alter a phase of the second optical signal relative to the first optical signal.

6. The apparatus of claim 5, wherein the optical demodulator further comprises:
an optical combiner configured to combine the filtered first optical signal and the filtered and phase-shifted second optical signal to produce a combined optical signal; and
a wavelength division multiplexer configured to separate the combined optical signal by wavelength to produce multiple optical signals.

7. The apparatus of claim 6, wherein the optical demodulator further comprises:
optical detectors configured to convert the multiple optical signals into the I and Q signals.

8. The apparatus of claim 1, wherein the photonic integrated circuit further comprises:
an optical amplifier optically coupled to the first optical switch;
an optical attenuator bank comprising multiple optical attenuators, wherein different ones of the optical attenuators are configured to provide different levels of attenuation;
a third optical switch configured to selectively provide the first optical signal to a selected one of the optical attenuators; and
a fourth optical switch configured to receive an attenuated first optical signal from the selected one of the optical attenuators and to provide the attenuated first optical signal to the optical amplifier.

9. A method comprising:
modulating a radio frequency (RF) input signal onto a first optical signal;
modulating a local oscillator (LO) signal onto a second optical signal; and
using a photonic integrated circuit comprising an optical demodulator, generating, based on the first and second modulated optical signals, I and Q signals representing a demodulated version of the RF input signal;
wherein generating the I and Q signals comprises:
filtering the first optical signal using a selected one of multiple optical filters;
filtering the second optical signal;
altering a phase of the second optical signal relative to the first optical signal;

combining the filtered first optical signal and the filtered and phase-shifted second optical signal to produce a combined optical signal;

separating the combined optical signal by wavelength to produce multiple optical signals; and converting the multiple optical signals into the I and Q signals.

10. The method of claim 9, wherein generating the I and Q signals further comprises, prior to filtering the first optical signal:

attenuating the first optical signal using a selected one of multiple optical attenuators; and amplifying the attenuated first optical signal.

11. A system comprising:

a radio frequency (RF) front end configured to obtain an RF input signal;

a photonic integrated circuit comprising:

a first modulator configured to modulate the RF input signal onto a first optical signal;

a second modulator configured to modulate a local oscillator (LO) signal onto a second optical signal; and an optical demodulator configured to generate, using the first and second modulated optical signals, I and Q signals representing a demodulated version of the RF input signal;

an analog-to-digital converter configured to convert the I and Q signals into digital values; and a processor configured to process the digital values, wherein the optical demodulator comprises:

an optical filter bank comprising multiple optical filters, wherein different ones of the optical filters are configured to pass different frequencies or frequency ranges;

a first optical switch configured to selectively provide the first modulated optical signal to a selected one of the optical filters; and a second optical switch configured to receive a filtered first optical signal from the selected one of the optical filters.

12. The system of claim 11, wherein the optical demodulator further comprises:

an additional optical filter configured to filter the second optical signal; and a phase shifter configured to alter a phase of the second optical signal relative to the first optical signal.

13. The system of claim 12, wherein the optical demodulator further comprises:

an optical combiner configured to combine the filtered first optical signal and the filtered and phase-shifted second optical signal to produce a combined optical signal; and a wavelength division multiplexer configured to separate the combined optical signal by wavelength to produce multiple optical signals.

14. The system of claim 13, wherein the optical demodulator further comprises:

optical detectors configured to convert the multiple optical signals into the I and Q signals.

15. The system of claim 11, wherein the photonic integrated circuit further comprises:

an optical amplifier optically coupled to the first optical switch;

an optical attenuator bank comprising multiple optical attenuators, wherein different ones of the optical attenuators are configured to provide different levels of attenuation;

a third optical switch configured to selectively provide the first optical signal to a selected one of the optical attenuators; and a fourth optical switch configured to receive an attenuated first optical signal from the selected one of the optical attenuators and to provide the attenuated first optical signal to the optical amplifier.

16. The system of claim 11, wherein the system comprises:

multiple RF front ends configured to obtain multiple RF input signals;

multiple photonic integrated circuits configured to demodulate the multiple RF input signals; and multiple analog-to-digital converters; and wherein the multiple RF front ends, the multiple photonic integrated circuits, and the multiple analog-to-digital converters form multiple signal processing channels.

17. The system of claim 16, wherein:

at least some of the signal processing channels are configured to process different global navigation satellite system (GNSS) position signals; and the processor is configured to identify a geo-location based on the GNSS position signals.

18. The system of claim 17, wherein at least one of the signal processing channels is configured to process one or more non-GNSS signals within a frequency range of about 900 MHz to about 12 GHz.

19. A method comprising:

modulating a radio frequency (RF) input signal onto a first optical signal;

modulating a local oscillator (LO) signal onto a second optical signal; and using a photonic integrated circuit comprising an optical demodulator, generating, based on the first and second modulated optical signals, I and Q signals representing a demodulated version of the RF input signal, wherein generating the I and Q signals comprises:

using a first optical switch to selectively provide the first modulated optical signal to a selected one of multiple optical filters, wherein different ones of the optical filters are configured to pass different frequencies or frequency ranges;

filtering the first modulated optical signal using the selected one of the optical filters; and using a second optical switch to receive a filtered first optical signal from the selected one of the optical filters.

20. The method of claim 19, wherein the multiple optical filters comprise at least one of:

at least one narrowband optical filter; and one or more tunable optical filters.

21. The method of claim 20, wherein:

the at least one narrowband optical filter is configured to isolate global navigation satellite system-related signals; and the one or more tunable optical filters are configured to isolate signals over a frequency range of about 900 MHz to about 12 GHz.

* * * * *